(12) United States Patent
Haensch et al.

(10) Patent No.: US 9,166,072 B2
(45) Date of Patent: Oct. 20, 2015

(54) FIELD-EFFECT LOCALIZED EMITTER PHOTOVOLTAIC DEVICE

(75) Inventors: Wilfried E. Haensch, Somers, NY (US); Bahman Hekmatshoartabari, White Plains, NY (US); Devendra K. Sadana, Pleasantville, NY (US); Ghavam G. Shahidi, Pound Ridge, NY (US); Davood Shahrjerdi, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 438 days.

(21) Appl. No.: 13/603,389

(22) Filed: Sep. 4, 2012

(65) Prior Publication Data

US 2014/0060627 A1    Mar. 6, 2014

(51) Int. Cl.
  *H01L 31/06* (2012.01)
  *H01L 31/0216* (2014.01)
  *H01L 31/068* (2012.01)

(52) U.S. Cl.
  CPC ........ *H01L 31/02167* (2013.01); *H01L 31/068* (2013.01); *Y02E 10/547* (2013.01)

(58) Field of Classification Search
  None
  See application file for complete search history.

(56) References Cited

U.S. PATENT DOCUMENTS 5,084,747 A * 1/1992 Miyawaki ...................... 257/432
5,738,731 A * 4/1998 Shindo et al. .................. 136/249
8,603,900 B2 * 12/2013 Ramappa ........................ 438/514
2010/0263726 A1 * 10/2010 Kawasaki et al. ............. 136/261
2011/0284064 A1    11/2011 Engelhart
2012/0210932 A1    8/2012 Hekmatshoartabari et al.

OTHER PUBLICATIONS

G.C. Salter, "Silicon Solar Cells Using Natural Inversion Layers Found in Thermally Oxidized p-Silicon", Solid State Electronics, 1977, vol. 20, pp. 95-104, Great Britain.
H. Fujioka, "Field Effect Solar Cell", Future Generation Photovoltaic Technologies: First NREL Conference, 1997, pp. 259-266, The American Institute of Physics.
H. Fujioka, "Characteristics of field effect a-Si:H solar cells", Journal of Non-Crystalline Solids 227-230, 1998, pp. 1287-1290, Elsevier Science B.V.
Nobuyuki Matsuki, "Field-effect a-Si:H solar cells with transparent conductive oxide comb-shaped electrodes", Thin Sold Films 486, 2005, pp. 210-213, Elsevier B.V.
G. De Cesare, "Experimental realization of field effect a-Si:H solar cells", Thin Solid Films 427, 2003, pp. 166-170, Elsevier Science B.V.
Nobuyuki Matsuki, "Concept and performance of a field-effect amorphous silicon solar cell", Semiconductor Science Tehnol. 19, 2004, pp. 61-64, IOP Publishing Ltd., United Kingdom.
Kaori Miyazaki, "Device simulation and fabrication of field effect solar cells", Bull. Mater. Sci., vol. 22, No. 3, May 1999, pp. 729-733.

* cited by examiner

*Primary Examiner* — Susan D Leong
(74) *Attorney, Agent, or Firm* — Louis J. Percello; Otterstedt, Ellenbogen & Kammer, LLP

(57) ABSTRACT

Photovoltaic structures are provided with field-effect inversion/accumulation layers as emitter layers induced by work-function differences between gate conductor layers and substrates thereof. Localized contact regions are in electrical communication with the gate conductors of such structures for repelling minority carriers. Such localized contact regions may include doped crystalline or polycrystalline silicon regions between the gate conductor and silicon absorption layers. Fabrication of the structures can be conducted without alignment between metal contacts and the localized contact regions or high temperature processing.

25 Claims, 5 Drawing Sheets

FIG. 8

$V_T = \phi_{MS}(<0) + 2\phi_F(>0) + Q_i/C_{ox}(\approx 0) + Q_d/C_{ox}(>0)$

EXAMPLES:

| Si RESISTIVITY | EOT | $2\phi_F$ | $\phi_{MS}$ | $Q_d/C_{ox}$ | $V_T$ |
|---|---|---|---|---|---|
| 15 Ω-cm | 10 nm | 0.57 V | −1.39 V | 0.038 V | −0.78 V |
| 0.25 Ω-cm | 10 nm | 0.80 V | −1.50 V | 0.402 V | −0.30 V |
| 15 Ω-cm | 1 nm | 0.57 V | −1.39 V | 0.004 V | −0.81 V |
| 0.25 Ω-cm | 1 nm | 0.80 V | −1.50 V | 0.040 V | −0.66 V |

FIELD-EFFECT LOCALIZED EMITTER PHOTOVOLTAIC DEVICE

FIELD

The present disclosure relates to the physical sciences, and, more particularly, to photovoltaic structures having emitter structures including field effect inversion or accumulation layers and forward biased junctions and fabrication methods for such structures.

BACKGROUND

Diffused-junction solar cells have been developed having homogeneous as well as double-diffused (selective) emitter structures. Homogeneous emitter structures have the same doping level under passivated and metal (e.g. finger contact) regions. In contrast, double-diffused emitter structures have relatively high doping levels under and aligned with the metal regions (also known as the metal grid) and lower doping levels between these regions. The highly doped regions repel minority carriers (holes) from the metal contacts. This arrangement provides good contact performance and low recombination losses. High efficiency solar cells have been achieved using double-diffused emitter structures.

FIG. 1 is a schematic illustration of a photovoltaic structure 20 including a double-diffused emitter structure. The emitter layer includes n+ regions 22 between n++ regions 24. The highly doped n++ regions are directly below metal fingers 26. The structure 20 further includes a dielectric anti-reflective coating (ARC) layer 28 adjoining one side of the emitter layer and a p-type silicon substrate 30 adjoining the opposite side thereof. The silicon substrate functions as an absorber layer. The fabrication process for forming photovoltaic structures including double-diffused emitters is relatively expensive because of the process complexity and high temperatures required for the process.

SUMMARY

Principles of the invention provide photovoltaic structures having induced emitter layers and localized contact regions for repelling minority carriers. A photovoltaic structure in accordance with a first exemplary embodiment includes a substrate comprising a semiconductor material, a top and bottom surface, and an absorption region. A dielectric layer is in direct contact with the top surface of the substrate, the dielectric layer including a plurality of holes extending therethrough. An electrically conductive layer contacts the dielectric layer. There is a sufficient work-function difference between the substrate and the electrically conductive layer to induce a field effect inversion or accumulation layer in the substrate. A plurality of forward biased junctions between the substrate and the electrically conductive layer are arranged for repelling minority carriers, each junction being in electrical communication with the electrically conductive layer.

A photovoltaic structure in accordance with a further embodiment includes a substrate comprised of a semiconductor material having a first conductivity type, a top surface, and an absorption region. A gate dielectric layer is in direct contact with the top surface of the substrate. A gate conductor layer in direct contact with the gate dielectric layer is comprised of an electrically conductive material and induces a field effect emitter layer near the top surface of the substrate by means of a work-function difference between the electrically conductive material comprising the gate conductor layer and the semiconductor material comprising the substrate. A plurality of discrete, localized contact regions repel minority carriers in the emitter layer, each contact region comprising a discrete portion of the substrate and being in electrical communication with the gate conductor layer.

A first exemplary method includes obtaining a structure comprising a substrate, the substrate comprising semiconductor material having a first conductivity type and an absorption region, and a dielectric layer adjoining the substrate, the dielectric layer including a plurality of openings exposing discrete areas of the substrate. The method further includes forming an electrically conductive layer comprised of an electrically conductive material on the structure such that a work-function difference between the electrically conductive material and the semiconductor material creates an induced emitter layer in the substrate and electrical communication is established between the electrically conductive layer and the discrete areas of the substrate, forming forward biased junctions that repel minority carriers.

A second exemplary method includes obtaining a substrate, the substrate comprising semiconductor material having a first doping type and an absorption region, depositing a thin dielectric layer on the substrate, and patterning the thin dielectric layer to form a plurality of openings therein and exposing discrete areas of the substrate. The method further includes forming an electrically conductive layer comprised of an electrically conductive material on the dielectric layer such that a work-function difference between the electrically conductive material and the semiconductor material creates an induced emitter layer in the substrate and electrical communication is established between the electrically conductive layer and the discrete areas of the substrate, forming forward biased junctions that repel minority carriers.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques and structures as disclosed herein can provide substantial beneficial technical effects. For example, one or more embodiments may provide one or more of the following advantages:

Fabrication process requires no alignment of metal contacts with emitter portions;
Low temperature fabrication;
Low-cost TCO materials usable;
High open circuit voltage;
High solar cell efficiency;
Reduced recombination at the emitter.

These and other features and advantages of the methods and structures disclosed herein will become apparent from the following detailed description of illustrative embodiments thereof, which is to be read in connection with the accompanying drawings.

BRIEF DESCRIPTION OF THE DRAWINGS

FIG. 8 shows a table showing calculated values of parameters relevant for obtaining negative threshold voltages in an n-channel structure.

DETAILED DESCRIPTION OF PREFERRED EMBODIMENTS

Photovoltaic structures are disclosed herein having emitter structures that are capable of functioning effectively as double-diffused (selective) emitters. A field effect inversion or accumulation layer induced by a conductive material functions as one of the emitter portions. A forward biased junction in electrical communication with the conductive material that induces the field effect inversion or accumulation layer functions as the other of the emitter portions. The two emitter portions of the photovoltaic structures effectively replace the relatively low and highly doped emitter regions that characterize double-diffused emitters. The specific embodiments discussed below, which are to be considered exemplary as opposed to limiting, are characterized by electron inversion layers in p-type silicon substrates.

Figure 2:
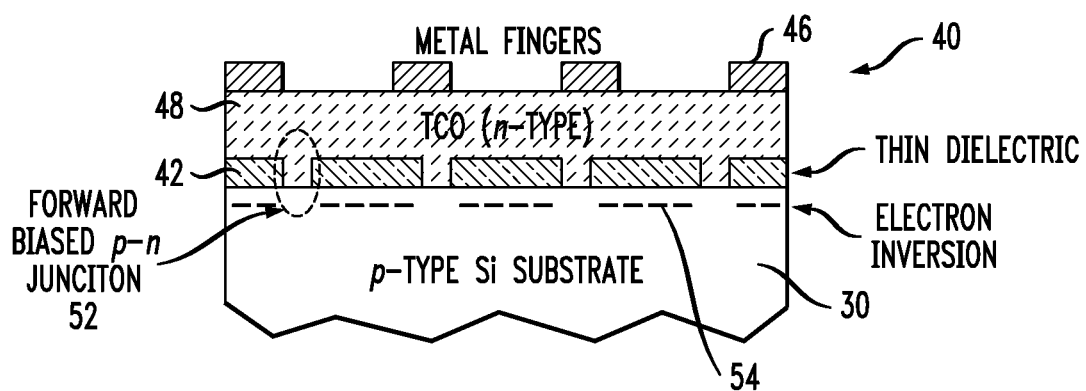
FIG. 2 shows a schematic illustration of a first exemplary embodiment of a photovoltaic structure having an inversion layer and a forward biased junction.

FIG. 2 shows a schematic illustration of a first exemplary photovoltaic structure 40. The structure includes a p-type silicon substrate 30 that, in part, functions as an absorber layer. A dielectric layer 42 adjoins the substrate. The equivalent oxide thickness (EOT) of the dielectric layer is lower than 250 nm, with equivalent oxide thicknesses lower than 25 nm being more preferred. The EOT refers to the thickness of oxide ($SiO_2$) dielectric needed to obtain the same dielectric capacitance as the one obtained with a different dielectric material having a different dielectric constant $\in_r$; e.g. EOT of 1 nm would result from the use a 10 nm thick material with dielectric constant (relative permittivity) of $\in_r=39$ ($\in_r$ of $SiO_2$ is 3.9). The dielectric capacitance ($C_i$) is defined as $\in_i/t_i$, where $\in_i$ is the permittivity of the dielectric defined as $\in_r \cdot \in_0$ where $\in_0 = 8.85 \times 10^{-12}$ F/m is the permittivity of free space (vacuum) and $t_i$ is the thickness of the dielectric layer. The dielectric layer may be comprised of insulating materials such as silicon dioxide, silicon nitride, aluminum oxide, hafnium oxide, tantalum oxide, and combinations thereof. Growth/deposition techniques that require lower temperatures compared to thermal oxidation of silicon are generally preferred over thermal oxidation due to a lower thermal budget and/or preserving the bulk lifetime of the silicon substrates. Examples include but not limited to plasma-enhanced chemical vapor deposition, atomic-layer deposition and sputtering. This layer 42 serves as a passivation layer and also as a gate dielectric, as discussed further below. An electrically conductive layer 48 having a conductivity type opposite to that of the substrate is formed on the dielectric layer. In one or more embodiments, the conductive layer comprises a transparent conductive oxide (TCO) material, which functions as the conductive gate material of the structure 40. As the substrate 30 in this exemplary embodiment is p-type, an n-type TCO layer 48 such as ZnO:Al is employed. The dielectric layer 42 includes holes/openings 50 that extend to the substrate 30. The diameter of the openings and the distance between the openings is typically chosen such that the total opening area is in the range of 0.1-5% of the cell area, which corresponds to the area of the top surface of the substrate adjoining the dielectric layer, although lower or higher ratios may be used as well. The diameter of the openings is typically in the range of 500 nm to 500 μm, although smaller or larger diameters may be used as well. The openings 50 are not necessarily circular and may be of any geometrical shape. The openings may be formed in the dielectric layer by various techniques known in the art, such as laser removal, nano-imprint or conventional lithography. Similar to conventional double-diffused emitters, or other conventional localized contact structures such as localized back contact or localized back surface field structures, decreasing the ratio of the total opening area to the cell area reduces the recombination rate and improves the open circuit voltage of the cell, at the cost of increasing the series resistance and therefore degrading the fill-factor of the solar cell. Since the solar cell efficiency depends on the product of the open circuit voltage and the fill-factor, an appropriate opening ratio is preferably used to maximize the cell efficiency. As known in the art, the optimum ratio depends on the effective surface recombination velocity of the minority carriers at the substrate/dielectric interface and at contact areas to substrate (TCO/substrate junction 52 in the case of FIG. 2), and the sheet resistance of the emitter. In conventional diffused emitters, the sheet resistance of the emitter is determined from the doping concentration and the diffusion profile of the diffused junction. In the field-effect emitter disclosed herein, the sheet resistance of the emitter ($R_{SE}$) depends on the density and field-effect mobility of carriers (electrons in this example) in the inversion layer and can be determined from the formula $R_{SE} = 1/(\mu_n C_i |V_T|)$, where $\mu_n$ is the field-effect electron mobility in the inversion layer, $C_i$ is the gate dielectric capacitance, and $V_T$ is the threshold voltage of the MOS stack, as will be explained later. The TCO layer 48 extends through these openings 50 so that it contacts both the dielectric layer and the substrate. A metal grid comprising metal fingers 46 adjoins the TCO layer 48.

The work-function difference between the conductive gate material (TCO in the exemplary embodiment of FIG. 2) and Si induces charge inversion (electrons in this example, as the substrate is p-type). Minority carriers (electrons) are drawn to the top surface of the substrate 30 while the majority carriers (holes) are displaced to create the induced layer 54, which functions as an emitter in the resulting device. The TCO/Si junctions create forward biased p-n junctions 52 that repel the minority carriers (holes in the inversion layer) from the junctions, thus reducing recombination at the TCO/Si contact regions. As known from the basic MOS theory, in order to have an inversion layer at zero gate bias, i.e. normally ON inversion layer, the threshold voltage of the MOS stack must be negative for an n-channel device (p-type Si in this example) and positive for a p-channel device, e.g. n-type Si substrate; i.e. $\phi_{MS} + 2\phi_F + Q_D/C_i + Q_i/C_i < 0$, for a p-type semiconductor, where $\phi_M$ is the workfunction of the gate material (TCO), $\phi_S$ is workfunction of the semiconductor (Si) defined as $\chi_S + E_i/q + \phi_F$ where $\chi_S$ is the electron affinity of semiconductor (4.05 eV for Si), $E_i$ the intrinsic energy level with respect to the valence band edge, approximately equal to $E_g/2$, where $E_g$ is the bandgap of the semiconductor (1.12 eV for Si), $q\phi_F$ is the Fermi level position with respect to the intrinsic level in the bulk of semiconductor (Si), i.e. $q\phi_F=kT \ln(N_A/n_i)$ (q is the electron charge, k the Boltzmann constant, T absolute temperature, $N_A$ the acceptor concentration, and $n_i$ the intrinsic carrier concentration), $Q_D$ the depletion charge in the semiconductor (Si), i.e. $Q_D=2\sqrt{qN_A \in_s \phi_F}$ where $\in_s$ is the permittivity of the semiconductor (Si), $C_i$ is the dielectric capacitance per unit area of the dielectric layer, i.e. $C_i = \in_i/t_i$ where $\in_i$ and $t_i$ are the permittivity and thickness of the dielectric layer 42, respectively, and $Q_i$ is the effective insulator charge (i.e. including all charges associated with the dielectric, such as the dielectric fixed/mobile charges, interface fixed charges/traps, etc.).

In one exemplary embodiment, assuming ZnO:Al as the TCO with a work-function of $\phi_M=3.8$ eV, and negligible insulator charge, i.e. $Q_i \approx 0$, the calculated values of the parameters described above are listed in the table shown in FIG. 8. ($V_T$ is the threshold voltage of the MOS stack as defined above and EOT is the oxide equivalent thickness of the insulator, i.e. $EOT=(\in_{ox}/\in_i)\times t_i$, where $\in_{ox}$ is permittivity of silicon dioxide). As seen in the table, negative threshold voltages are feasible, and thinner dielectric layers and/or higher dielectric constants facilitate more negative threshold voltages especially for lower resistivity wafers (note Si is p-type in this example). As discussed above, the formula $V_T=\phi_{MS}(<0)+2\phi_F(>0)+Q_i/C_i(\approx 0)+Q_D/C_i(>0)$ is applicable to the calculations of the threshold voltages appearing in the table.

Figure 1:
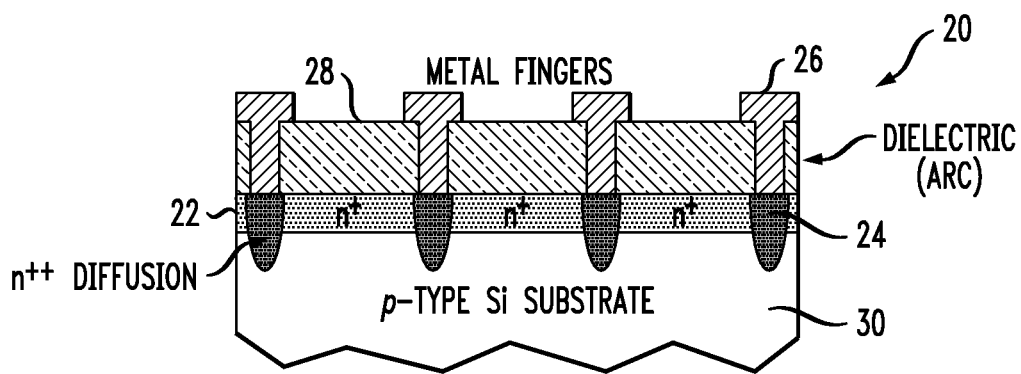
FIG. 1 shows a schematic illustration of a conventional photovoltaic structure including a double-diffused emitter.

Low-cost TCO materials having lower work-functions than relatively high-quality TCO materials can be employed and are preferable in one or more embodiments of the photovoltaic structures disclosed herein. TCO materials having relatively low work-functions are better for inversion as employed in such structures. For example, low-cost sputtered ZnO:Al (3.5-3.8 eV) has a lower work-function than high-quality indium tin oxide (ITO) or low-pressure chemical vapor deposition (LPCVD) ZnO:Al (4.2-4.8 eV). The emitter structure of the exemplary photovoltaic structure 40 shown in FIG. 2 is accordingly comprised of: 1) a field effect inversion layer 54 induced by means of the work-function differences between the TCO layer 48 and the crystalline silicon substrate 30, and 2) the forward biased p-n junctions 52 that are in electrical communication with the TCO layer 48. Carrier collection is achieved via localized contacts, i.e. forward-biased p-n junctions 52, to crystalline silicon. The term "localized contacts" is used in analogy to the highly doped regions 24 in the conventional double-diffused structure of FIG. 1, where the metal contacts are formed, typically referred to as localized contacts in the art. The lateral conductivity of the TCO layer 48 eliminates the need for alignment of the metal fingers 46 to the p-n junctions. The inversion layer 54, in effect, takes the place of the n+ regions 22 and the forward biased p-n junctions take the places of the n++ regions in the double-diffused emitter structure of the device 20 shown in FIG. 1.

Figure 3:
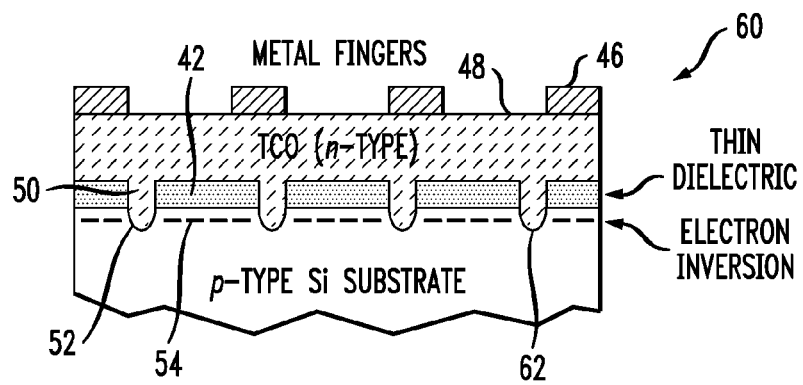
FIG. 3 shows a schematic illustration of a second exemplary embodiment of a photovoltaic structure having an inversion layer and a forward biased junction wherein the substrate is etched prior to TCO deposition.

FIG. 3 shows an alternative embodiment of a photovoltaic device 60 wherein the silicon substrate 30 is partially etched to form recesses 62 therein prior to TCO deposition. The dielectric layer 42 is employed as an etch mask for a wet etching process in the fabrication of the device 60 in accordance with an exemplary fabrication process. The TCO layer 48 accordingly adjoins the dielectric layer 42, extends through the openings 50 in the dielectric layer and into the recesses 62. The larger contact areas between the TCO layer and substrate obtained by forming the recesses 62 improves the effect of the forward biased p-n junction 52 in repelling the minority holes. The emitter structure of the device includes forward biased p-n junctions 52 and an inversion layer 54 induced by the work-function difference between the TCO layer 48 and the crystalline silicon comprising the substrate 30. The absorption layer or region of the substrate is beneath the emitter structure and remains p-type in the exemplary embodiment.

Figure 4:
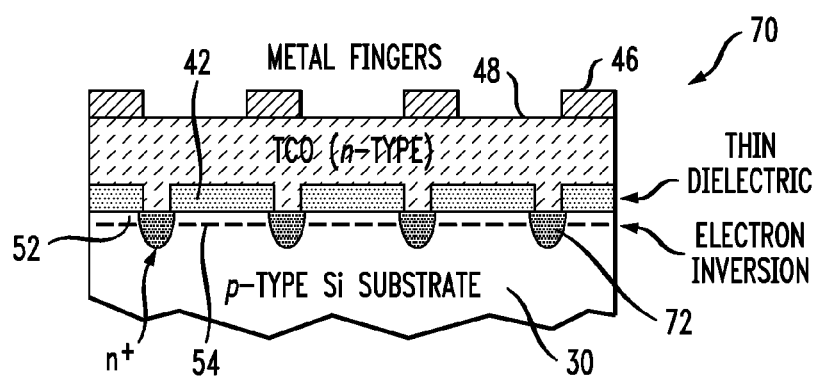
FIG. 4 shows a schematic illustration of a third exemplary embodiment of a photovoltaic structure having an inversion layer and a forward biased junction wherein doped regions are provided within the substrate.

FIG. 4 shows a third embodiment similar to that shown in FIG. 3, wherein the photovoltaic device 70 includes n+ doped regions 72 within the recesses 62. The doped regions can be grown following etching of the substrate 30 and prior to TCO deposition as shown. These regions comprise thin layers of n+ epitaxial silicon in some embodiments. Alternatively, the doped regions are diffused within the substrate using the dielectric layer 42 as a mask. In this embodiment wherein a p-type substrate is employed, the doped regions 72 are n+ regions. At sufficiently high doping levels, the doped regions 72 can provide a forward-biased junction with a higher built-in potential, and therefore a stronger electric field for repelling the minority holes. The doping level of the highly doped n$^+$ regions is typically larger than $5\times 10^{18}$ cm$^{-3}$, with doping levels higher than $5\times 10^{19}$ cm$^{-3}$ being more preferred. The emitter structure of the device 70 includes forward biased p-n junctions 52 and an inversion layer 54 induced by the work-function difference between the TCO layer 48 and the crystalline silicon comprising the substrate 30.

Figure 5:
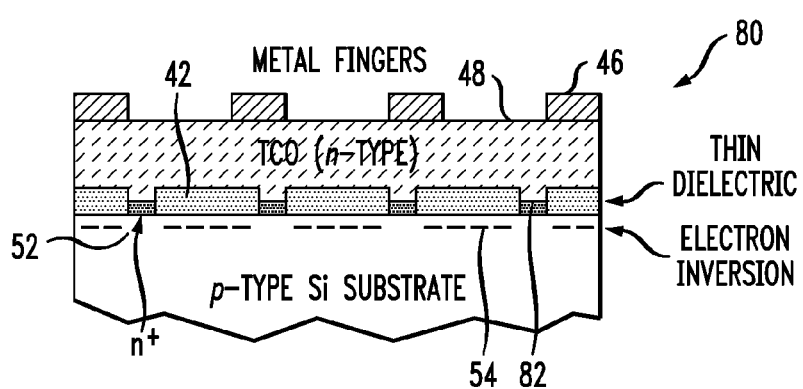
FIG. 5 shows a schematic illustration of a fourth exemplary embodiment of a photovoltaic structure having an inversion layer and a forward biased junction wherein a doped layer is grown or deposited prior to TCO deposition.

FIG. 5 shows a photovoltaic device 80 in accordance with a fourth exemplary embodiment wherein the substrate 30 is not etched prior to deposition of highly doped layers. A thin layer of epitaxial n+ silicon is grown selectively at the discrete substrate contact areas prior to TCO deposition, forming n+ doped regions 82. Alternatively, the n+ doped regions can be deposited on the substrate 30. The TCO material contacts both the dielectric layer 42 and the doped regions 82, creating forward biased p-n junctions 52.

Summarizing the embodiments of FIGS. 3-5, the absorption layer (Si) is etched in some embodiments, e.g. by wet etching, by optionally using the dielectric layer 42 as an etch mask prior to TCO deposition such as in the embodiment of FIG. 3. In other embodiments, doped regions are introduced in the absorption layer 30, for example by diffusion, by optionally using the dielectric layer 42 as a diffusion (or implantation/diffusion) mask prior to TCO deposition. The device 70 shown in FIG. 4 can be fabricated in this manner. In another embodiment (also illustrated by FIG. 4), the absorption layer is etched followed by the growth/deposition of a doped layer (single crystalline or polysilicon) prior to TCO deposition. In some of these embodiments, the doped layer is grown selectively (growing only on areas where the absorption layer is exposed), for example by known selective epitaxial growth techniques such as chemical vapor deposition (CVD). In some other embodiments, the doped layer (typically polysilicon) is deposited (e.g. by CVD) and patterned. In some embodiments, the absorption layer 30 is not etched prior to growth/deposition of the highly doped layers, such as in the embodiment of FIG. 5. In one particular embodiment, the selective epitaxial growth of the doped layer (either with or without prior etching of the absorption layer) is through ultra-low-temperature plasma enhanced chemical vapor deposition (PECVD). Using this method, growth is epitaxial (single-crystalline or poly) on the exposed areas of the absorption layer 30, while amorphous or nanocrystalline on top of the dielectric layer 42. The amorphous layer is then selectively removed from on top of the insulator layer, for example by hydrogen (H) plasma etching, which could be performed in the same PECVD reactor. The gas sources used for the epitaxial growth of the Si containing layer may include but not limited to SiH$_4$ (silane), Si$_2$H$_4$ (disilane), SiF$_4$ (tetrafluorosilane) precursor gas, and combinations thereof, and H$_2$ carrier/dilution gas. Typically the dilution gas to precursor gas flow ratio, e.g. [H$_2$]/[SiH$_4$]>5. The dopant gases (flowed in-situ) may include but are not limited to PH$_3$ (phosphine) for n-type doping, and B$_2$H$_6$ (diborane) or TMB (tri-methylboron) for p-type doping. These layers may contain germanium (Ge), nitrogen (N), oxygen (O), fluorine (F), deuterium (D), chlorine (Cl), carbon (C) or combinations thereof. The preferred technique for growing these materials is plasma-enhanced chemical vapor deposition (PECVD); however, other growth such as hot-wire CVD (HWCVD) may be used. Growth temperatures are typically close to 200° C.; however growth temperatures in the range of room-temperature to 450° C. may be used. Further details regarding the epitaxial growth and selective removal process are described in U.S. patent application Ser. No. 13/032866 filed Feb. 23, 2011 entitled "Low-Temperature Selective Epitaxial Growth of Silicon for Device integration", which is incorporated by reference herein.

Figure 6A:
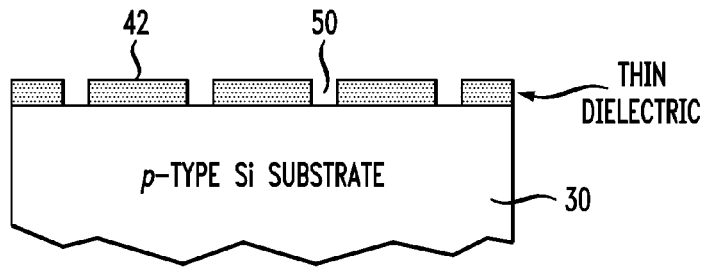
FIGS. 6A-6D show an exemplary flow diagram for fabrication of a photovoltaic structure as shown in FIG. 5.
Figure 6B:
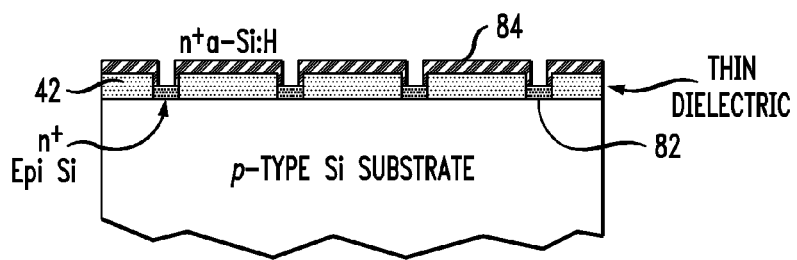
Figure 6C:
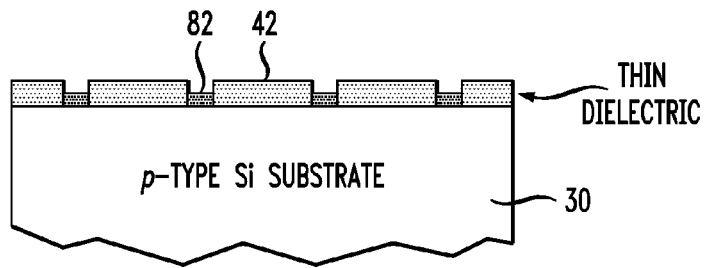
Figure 6D:
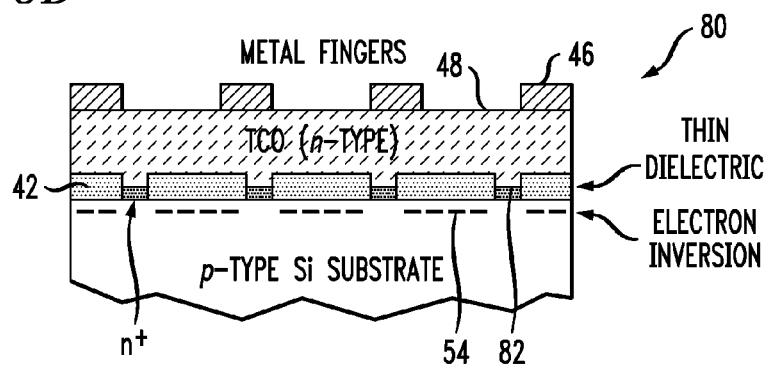

An exemplary method for fabricating the photovoltaic device 80 shown in FIG. 5 is schematically illustrated in the flow diagram provided by FIGS. 6A-6D. Referring to FIG. 6A, a thin dielectric layer 42 is deposited and patterned using conventional techniques. The openings 50 formed in the dielectric layer expose discrete areas of the surface of the silicon substrate 30. A doped silicon layer is deposited using a PECVD process. This layer grows epitaxially on the silicon substrate 30 while forming an amorphous layer on the dielectric layer 42. A layer including epitaxial regions 82 and amorphous regions 74 is accordingly formed, as shown in FIG. 6B. The amorphous regions 84 are removed selectively, preferably in situ, with hydrogen plasma to form the structure comprising the substrate 30, n+ doped regions 82 and the patterned dielectric layer 42 shown in FIG. 6C. The TCO layer 48 and metal fingers 46 are formed using conventional techniques familiar to those of skill in the art. The photovoltaic device 80 as shown in FIG. 6D is accordingly obtained.

Although Si has been used as an exemplary absorption layer in the embodiments described above, any semiconducting layer can be used as an absorption layer. Examples are SiGe, SiC, Ge, and various III-V materials (n-type or p-type). In addition, any conductive material with a work-function satisfying the threshold voltage requirement (negative for p-type and positive for n-type substrates) may be used. The conductive material may not necessarily be transparent. In some embodiments, a very thin metal layer (not shown) which would not otherwise be sufficiently transparent could be used without or with a TCO overlayer. Since a thin metal is not sufficiently conductive, a TCO overlayer may be used to provide sufficient conductivity, while the work-function of the gate stack is still determined by that of the thin metal layer. In some embodiments, a thick conductive layer which is not transparent may be used. However, in these embodiments, the back contact (not shown) is comprised of a transparent conductive material such as a TCO to allow light to enter the absorption layer from the backside. At least one of the top or bottom contacts of the photovoltaic device needs to be sufficiently transparent to allow light to enter the absorber. If a thick metal layer or a thin metal layer with a TCO overlayer is used instead of the TCO material, junction 52 in FIGS. 2 and 3 will be a Schottky junction rather than a p-n junction. A Schottky junction 52 behaves similar to a p-n junction, repelling the minority holes from the substrate surface.

Figure 7A:
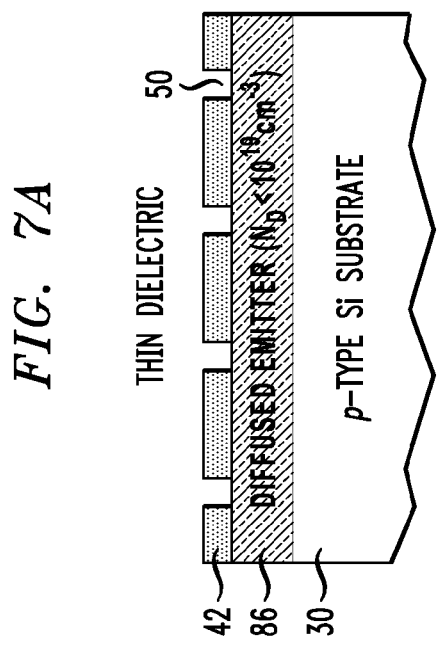
FIGS. 7A and 7B show two exemplary fabrication steps for making a photovoltaic structure according to a further embodiment.
Figure 7B:
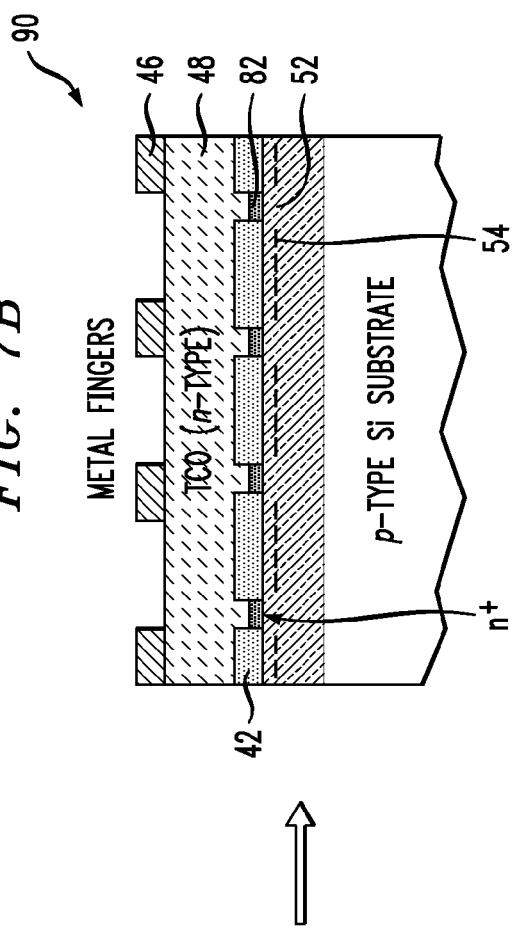

FIGS. 7A and 7B disclose two steps of a fabrication process that may be employed to make a device similar to that shown in FIG. 5. The substrate 30 comprises a diffused emitter 86. In this exemplary embodiment, the doping concentration $N_D$ is less than $10^{19}$ cm$^{-3}$. A thin dielectric layer 42 is deposited and patterned using conventional techniques. The thin dielectric layer 42 may optionally be a thermal oxide layer used for diffusion drive-in. Doped regions 82 are formed on the diffused emitter using, for example, the technique described above with reference to FIGS. 6B and 6C. An n-type TCO layer 48 and metal fingers 46 are formed on the structure using conventional techniques familiar to those of skill in the art. Sputtering and CVD processes are among the conventional techniques for depositing TCO layers. In conventional single-emitter solar cells, where the emitter region is formed by diffusion similar to region 86 in FIGS. 7A and 7B, the doping concentration of the emitter region (which is typically 200 nm-1 µm deep) is typically chosen below $N_D=10^{19}$ cm$^3$ to limit Auger recombination in the emitter region. Therefore, higher doping levels which would be beneficial in establishing a stronger electric field at the emitter for better carrier separation are not practical. In FIG. 7B; however, the higher doping level is provided by the accumulation layer 54, which is very thin (of the order of the Debye screening length in Si), therefore resulting in negligible Auger recombination. Therefore higher open circuit voltages (and higher short circuit currents) can be achieved using the structure of FIG. 7B, compared to the conventional single-emitter structure. In some embodiments, the presence of the diffused region 86 may be advantageous (compared to the structure of FIG. 5 which lacks the diffused region) for two reasons, (1) the sheet resistance of the emitter is reduced due to the presence of the diffused region 86, allowing higher fill-factor by reducing the lateral series resistance of the semiconductor between the adjacent openings in the dielectric and/or allow the usage of larger separations between the openings without compromising the fill-factor, and (2) the sensitivity of the solar cell performance to possible resistivity variation over the wafer area or resistivity variation from wafer to wafer is reduced. (Such resistivity variations are not uncommon in solar grade Si wafers). This is because the emitter sheet resistance will be independent of the bulk wafer resistivity and rather determined by the doping level of the diffused region. The formation of an accumulation layer requires the accumulation of electrons at levels higher than that already present due to the n-type doping of the diffused region 86. To meet this condition, the dielectric capacitance and the conductive gate must be chosen such that $-\phi_{MS}C_i > qN_DL_D$ (note $\phi_{MS}<0$), where $L_D$ is the Debye screening length in diffusion region 86, defined as $L_D = \sqrt{\in_s kT/(q^2 N_D)}$. Since the doping of the diffused region 86 is n-type, the workfunction of the semiconductor $\phi_S + E_f/q - \phi_F$, where $q\phi_F$ is the Fermi level position with respect to the intrinsic level in the diffused region 86 (in contrast to that in the hulk of the semiconductor which was the case for the examples of FIGS. 2-5), i.e. $q\phi_F = kT \ln(N_D/n_i)$. For example, if $N_D = 10^{19}$ cm$^{-3}$, then $L_D \approx 1.3$ nm and $\phi_S \approx 4.2$ eV. Assuming that the TCO has a work-function of $\phi_M = 3.8$ eV, EOT must be chosen to be below ~5 nm to meet the above condition. A photovoltaic device 90 having forward biased p-n junctions 52 and an inversion layer 54 induced by the work-function difference between the TCO layer 48 and the crystalline silicon comprising the substrate 30 is accordingly formed.

Those of skill in the art will appreciate that the principles of the invention also apply to tandem/multi-junction solar cells with top and/or bottom contact regions, double-gated photovoltaic structures, and to devices incorporating one or more of the photovoltaic structures disclosed herein. Light may enter photovoltaic structures such as those disclosed herein from the top, bottom and/or both sides.

Given the discussion thus far, it will be appreciated that, in general terms, an exemplary photovoltaic structure, according to one exemplary embodiment, includes a substrate comprising a semiconductor material, a top surface, and an absorption region. An exemplary substrate 30 is shown and described with respect to FIGS. 2-5, 6A-D and 7A-B. A dielectric layer 42 is in direct contact with the top surface of the substrate, the dielectric layer including a plurality of holes 50 extending therethrough. An electrically conductive layer 48 contacts the dielectric layer. There is a sufficient work-function difference between the substrate and the electrically conductive layer to induce a field effect inversion or accumulation layer 54 in the substrate. A plurality of forward biased junctions between the substrate and the electrically conductive layer are arranged for repelling minority carriers, each junction being in electrical communication with the electrically conductive layer. Exemplary junctions 52 are shown in FIGS. 2 and 3, where the electrically conductive layer directly contacts the substrate and in FIGS. 4, 5, 6D and 7B where highly doped regions are provided between the electrically conductive layer and the substrate. One or more embodiments of the exemplary photovoltaic structure include a plurality of metal contacts 46 in electrical contact with the electrically conductive layer. Such contacts 46 may be in the form of finger-like structures as described above. In further embodiments of the exemplary photovoltaic structure, the electrically conductive layer has a conductivity type opposite to that of the substrate. For example, in one or more embodiments the semiconductor material is p-type, the electrically conductive layer is n-type, and the field effect layer is an electron inversion layer. The photovoltaic structure further includes a plurality of recesses within the substrate in some exemplary embodiments, the recesses being aligned with the holes in the dielectric layer. Such recesses 62 are shown in FIG. 3. In some embodiments, the photovoltaic structure further includes a doped n+ material in the recesses, the electrically conductive layer contacting the doped material. FIG. 4 is illustrative of such an arrangement. The electrically conductive layer extends through the holes 50 into the recesses 62 in some embodiments, such as shown in FIG. 3. The electrically conductive layer is comprised of a metal layer and a transparent conductive oxide layer that overlies the metal layer in some embodiments. As discussed above, if the electrically conductive layer is comprised of a thick metal layer or a thin metal layer with a TCO overlayer instead of only TCO material, junctions 52 in the exemplary embodiments of FIGS. 2 and 3 will be Schottky junctions rather than p-n junctions. The junctions can each be comprised of a doped region adjoining the substrate for repelling minority carriers in one or more embodiments of the exemplary structure. In such embodiments, the semiconductor material may comprise p-type silicon, the doped regions may comprise n+ crystalline or polycrystalline silicon, the electrically conductive layer may comprise an n-type transparent conductive oxide material, and the field effect layer will be an electron inversion layer. The doped regions adjoin the top surface of the substrate, such as shown in FIGS. 5, 6D and 7B in some embodiment of the photovoltaic structure. The doped regions extend beneath the top surface of the substrate in some embodiments, such as described above with respect to FIG. 4. The photovoltaic structure further includes a diffused emitter layer 86 adjoining the dielectric layer 42 in some embodiments, as described above with respect to FIGS. 7A and 7B. The dielectric layer may have an equivalent oxide thickness (EOT) of less than 25 nanometers in any embodiment of the photovoltaic structure.

The electrically conductive layer comprises a transparent conductive oxide material in one or more embodiments. The absorption region comprises an epitaxial silicon layer in one or more exemplary embodiments of the photovoltaic structure. The holes in the dielectric layer have a combined area comprising 0.1-5.0% of the area of the top surface of the substrate in exemplary embodiments of the photovoltaic structure.

A photovoltaic structure in accordance with a further embodiment includes a substrate comprised of a semiconductor material having a first conductivity type, a top surface, and an absorption region. A gate dielectric layer 42 is in direct contact with the top surface of the substrate 30. A gate conductor layer 48 in direct contact with the gate dielectric layer is comprised of an electrically conductive material and induces a field effect emitter layer 54 near the top surface of the substrate by means of a work-function difference between the electrically conductive material comprising the gate conductor layer and the semiconductor material comprising the substrate. A plurality of discrete, localized contact regions repel minority carriers in the emitter layer, each contact region comprising a discrete portion of the substrate and being in electrical communication with the gate conductor layer. As discussed above, such localized contact regions can comprise p-n junctions in some embodiments and Schottky junctions in other exemplary embodiments. The gate conductor layer has a conductivity type opposite to the first conductivity type in one or more embodiments of the structure. The semiconductor material comprises crystalline silicon, and the structure further includes metal contacts adjoining the gate conductor layer in some embodiments. The gate dielectric layer may have an equivalent oxide thickness (EOT) of less than 25 nanometers as discussed further above. Each discrete contact region may comprise a highly doped region of crystalline or polycrystalline silicon between one of the discrete portions of the substrate and the gate conductor layer for repelling minority carriers in the emitter layer. The substrate further includes a diffused emitter layer in some embodiments as discussed above with respect to FIGS. 7A-B. The photovoltaic structure of certain embodiments further includes a plurality of recesses 62 within the substrate and a plurality of holes extending through the gate dielectric layer, the recesses being aligned with the holes.

A first exemplary method includes obtaining a structure comprising a substrate 30, the substrate comprising semiconductor material having a first conductivity type and an absorption region, and a dielectric layer 42 adjoining the substrate, the dielectric layer including a plurality of openings 50 exposing discrete areas of the substrate. The method further includes forming an electrically conductive layer 48 comprised of an electrically conductive material on the structure such that a work-function difference between the electrically conductive material and the semiconductor material creates an induced emitter layer 54 in the substrate and electrical communication is established between the electrically conductive layer and the discrete areas of the substrate, forming forward biased junctions 52 that repel minority carriers. Exemplary junctions disclosed above include p-n junctions and Schottky junctions, which function similarly in the context of the structures and methods provided herein. The method may further include forming metal contacts 46 on the electrically conductive layer 48. The metal contacts in one or more embodiments comprise a metal grid, wherein the method further includes forming the metal grid on the electrically conductive layer without aligning the metal grid to the discrete areas of the substrate. The step of forming doped regions on the discrete areas of the substrate that repel minority carriers in the emitter layer is provided in one or more embodiments of the method, wherein the step of forming the electrically conductive layer on the dielectric layer further includes causing the electrically conductive layer to contact the doped regions. The absorption layer is comprised of crystalline silicon and the doped regions are comprised of crystalline or polycrystalline silicon in one or more embodiments. The method may further include depositing a doped silicon layer 84 on the discrete areas of the substrate and on the dielectric layer 42 such that growth of the doped silicon layer is epitaxial on the discrete areas of the substrate to form the doped regions and amorphous on the dielectric layer, and selectively removing the amorphous portion of the silicon layer from the dielectric layer. FIGS. 6B-C and the accompanying portions of the specification describe this process. The substrate is comprised of p-type silicon, the electrically conductive material comprising the electrically conductive layer is n-type, and the induced emitter layer in the substrate is an electron inversion layer in one or more embodiments of the method. The obtained structure further includes a diffused emitter layer 86 within the substrate in some exemplary embodiments, as discussed above with respect to FIG. 7A. Highly doped regions are formed on the discrete areas of the substrate, wherein the step of forming the electrically conductive layer on the dielectric layer further includes causing the electrically conductive layer to contact the doped regions, in one or more embodiments. One or more embodiments of the method further include forming recesses 62 in the substrate 30 aligned with the openings 50 in the dielectric layer. The discussion above with respect to FIG. 3 relates to the formation of such recesses. The method further includes depositing highly doped material within the recesses in some embodiments, as discussed above with respect to FIG. 4. The dielectric layer has an equivalent oxide thickness (EOT) of less than 25 nanometers in exemplary embodiments of the method. The openings in the dielectric layer may have a combined area comprising 0.1-5.0% of the area of the top surface of the substrate in accordance with the exemplary method. The electrically conductive material of the electrically conductive layer has a conductivity type opposite to the first conductivity type in one or more embodiments.

A second exemplary method includes obtaining a substrate, the substrate comprising semiconductor material having a first doping type and an absorption region, depositing a thin dielectric layer on the substrate, and patterning the thin dielectric layer to form a plurality of openings therein and exposing discrete areas of the substrate. FIG. 6A is illustrative of a structure obtained following such steps. The method further includes forming an electrically conductive layer 48 comprised of an electrically conductive material on the dielectric layer such that a work-function difference between the electrically conductive material and the semiconductor material creates an induced emitter layer 54 in the substrate and electrical communication is established between the electrically conductive layer and the discrete areas of the substrate, forming forward biased junctions 52 that repel minority carriers. The method further includes forming metal contacts 46 on the electrically conductive layer in one or more embodiments thereof. The metal contacts comprise a metal grid in certain embodiments, wherein the method may further include forming the metal grid on the electrically conductive layer without aligning the metal grid to the discrete areas of the substrate. One or more further embodiments of the second exemplary method further includes forming doped regions on the discrete areas of the substrate, the doped regions having a doping type opposite to the first doping type, wherein the step of forming the electrically conductive layer on the dielectric layer further includes causing the electrically conductive layer to contact the doped regions. FIGS. 6B-D illustrate a process for performing such steps, it being understood that other processes such as diffusion or implantation can also be employed for providing doped regions on the substrate. The absorption layer is comprised of crystalline silicon and the doped regions are comprised of crystalline or polycrystalline silicon in one or more embodiments. The method may further include steps as discussed particularly with respect to FIGS. 6A-D, such as depositing a doped silicon layer 84 on the discrete areas of the substrate 30 and on the dielectric layer 42 such that growth of the doped silicon layer is epitaxial on the discrete areas of the substrate to form the doped regions 82 and amorphous on the dielectric layer, and selectively removing the amorphous portion of the doped silicon layer 84 from the dielectric layer. The substrate is comprised of p-type silicon, the electrically conductive material comprising the electrically conductive layer is n-type, the induced emitter layer in the substrate is an electron inversion layer, and the dielectric layer deposited on the substrate has an equivalent oxide thickness (EOT) of less than 25 nanometers in one or more embodiments of the method. The obtained substrate further includes a diffused emitter layer in certain embodiments, such as illustrated schematically in FIG. 7A. The second exemplary method further includes forming n+ doped regions on the discrete areas of the substrate, wherein the step of forming the electrically conductive layer on the dielectric layer further includes causing the electrically conductive layer to contact the doped regions, in one or more further embodiments thereof. One or more exemplary embodiments of the method further includes forming recesses in the substrate aligned with the openings in the dielectric layer, such as discussed above with reference to FIG. 3. In embodiments employing such recesses, the method further includes depositing highly doped material within the recesses that repel minority carriers in some embodiments. In other exemplary embodiments, the electrically conductive layer extends within the recesses.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Unless otherwise indicated, words such as "top" and "bottom" refer to relative positions of elements as opposed to whether they are facing up or down. The same reference numbers, where employed in association with elements of more than one disclosed embodiment, are intended to signify the same or similar elements that may be incorporated in such embodiments.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A photovoltaic structure comprising:
   a substrate comprising a semiconductor material, a top surface, and an absorption region;
   a dielectric layer in direct contact with the top surface of the substrate, the dielectric layer including a plurality of holes extending therethrough;
   an electrically conductive layer in direct contact with the dielectric layer, there being a sufficient work-function difference between the substrate and the electrically conductive layer to induce a field effect inversion or accumulation layer in the substrate, and
   a plurality of forward biased junctions between the substrate and the electrically conductive layer and arranged for repelling minority carriers, each junction being in electrical communication with the electrically conductive layer.

2. The photovoltaic structure of claim 1, further including a plurality of metal contacts in electrical contact with the electrically conductive layer.

3. The photovoltaic structure of claim 2, wherein the electrically conductive layer has a conductivity type opposite to that of the substrate.

4. The photovoltaic structure of claim 3, wherein the semiconductor material is p-type, the electrically conductive layer is n-type, and the field effect layer is an electron inversion layer.

5. The photovoltaic structure of claim 3, further including a plurality of recesses within the substrate, the recesses being aligned with the holes in the dielectric layer.

6. The photovoltaic structure of claim 5, further including a doped n+ material in the recesses, the electrically conductive layer contacting the doped material.

7. The photovoltaic structure of claim 5, wherein the electrically conductive layer extends through the holes into the recesses.

8. The photovoltaic structure of claim 2, wherein the electrically conductive layer is comprised of a metal layer and a transparent conductive oxide layer that overlies the metal layer.

9. The photovoltaic structure of claim 2, wherein each of the junctions comprises a doped region adjoining the substrate for repelling minority carriers.

10. The photovoltaic structure of claim 9, wherein the semiconductor material comprises p-type silicon, the doped regions comprise n+ crystalline or polycrystalline silicon, the electrically conductive layer comprises an n-type transparent conductive oxide material, and the field effect layer is an electron inversion layer.

11. The photovoltaic structure of claim 9, wherein the doped regions adjoin the top surface of the substrate.

12. The photovoltaic structure of claim 9, wherein the doped regions extend beneath the top surface of the substrate.

13. The photovoltaic structure of claim 1, wherein the substrate further includes a diffused emitter layer adjoining the dielectric layer.

14. The photovoltaic structure of claim 1, wherein the dielectric layer has an equivalent oxide thickness (EOT) of less than 25 nanometers.

15. The photovoltaic structure of claim 14, wherein the electrically conductive layer comprises a transparent conductive oxide material.

16. The photovoltaic structure of claim 14, wherein the absorption region comprises an epitaxial silicon layer.

17. The photovoltaic structure of claim 14, wherein the holes in the dielectric layer have a combined area comprising 0.1-5.0% of the area of the top surface of the substrate.

18. The photovoltaic structure of claim 14, wherein each of the junctions comprises a doped region adjoining the substrate for repelling minority carriers.

19. A photovoltaic structure comprising:
    a substrate comprised of a semiconductor material having a first conductivity type, a top surface, and an absorption region;
    a gate dielectric layer in direct contact with the top surface of the substrate;
    a gate conductor layer in direct contact with the gate dielectric layer, the gate conductor layer being comprised of an electrically conductive material, the gate conductor layer inducing a field effect emitter layer near the top surface of the substrate by means of a work-function difference between the electrically conductive material comprising the gate conductor layer and the semiconductor material comprising the substrate, and
    a plurality of discrete, localized contact regions for repelling minority carriers in the emitter layer, each contact region comprising a discrete portion of the substrate and being in electrical communication with the gate conductor layer.

20. The photovoltaic structure of claim 19, wherein the gate conductor layer has a conductivity type opposite to the first conductivity type.

21. The photovoltaic structure of claim 20, wherein the semiconductor material comprises crystalline silicon, and further including metal contacts adjoining the gate conductor layer.

22. The photovoltaic structure of claim 21, wherein the gate dielectric layer has an equivalent oxide thickness (EOT) of less than 25 nanometers.

23. The photovoltaic structure of claim 21, wherein each discrete contact region comprises a highly doped region of crystalline or polycrystalline silicon between one of the discrete portions of the substrate and the gate conductor layer for repelling minority carriers in the emitter layer.

24. The photovoltaic structure of claim 21, wherein the substrate further includes a diffused emitter layer.

25. The photovoltaic structure of claim 19, further including a plurality of recesses within the substrate and a plurality of holes extending through the gate dielectric layer, the recesses being aligned with the holes.

* * * * *